United States Patent [19]

Devins et al.

[11] Patent Number: 4,694,375
[45] Date of Patent: Sep. 15, 1987

[54] ADDITIVES TO PREVENT ELECTROSTATIC CHARGE BUILDUP IN FLUIDS IN HIGH VOLTAGE SYSTEMS

[75] Inventors: John C. Devins, Burnt Hills, N.Y.; Matthew A. Dranchak, Mt. Laurel, N.J.; Stefan J. Rzad, Rexford, N.Y.

[73] Assignee: General Electric Company, Schenectady, N.Y.

[21] Appl. No.: 360,264

[22] Filed: Mar. 22, 1982

Related U.S. Application Data

[63] Continuation-in-part of Ser. No. 140,244, Apr. 14, 1980, abandoned.

[51] Int. Cl.⁴ .............................................. H01G 1/08
[52] U.S. Cl. .................................... 361/212; 361/215; 361/379
[58] Field of Search ............... 361/212, 215, 385, 382, 361/379

[56] References Cited

U.S. PATENT DOCUMENTS

| | | | |
|---|---|---|---|
| 2,643,282 | 6/1953 | Greene | 361/385 X |
| 3,383,560 | 5/1968 | Ginsburgh | 361/215 |
| 3,524,497 | 8/1970 | Chu et al. | 361/385 X |
| 3,619,718 | 11/1971 | Leonard | 361/215 |
| 3,651,865 | 3/1972 | Feldmanis | 361/385 X |
| 3,989,102 | 11/1976 | Jaster et al. | 361/385 X |
| 4,302,216 | 11/1981 | Spence | 44/71 |

Primary Examiner—L. T. Hix
Assistant Examiner—David Porterfield
Attorney, Agent, or Firm—Lawrence D. Cutter; James C. Davis, Jr.; Marvin Snyder

[57] ABSTRACT

An ionic material is added to a halocarbon insulating fluid used to cool high voltage equipment in order to prevent the buildup of electrtostatically generated charge. The ionic additive allows leakage of charge from the insulating fluid so as to prevent dangerously high voltage buildup while at the same time withstanding the high voltage applied to the system.

16 Claims, 2 Drawing Figures

ADDITIVES TO PREVENT ELECTROSTATIC CHARGE BUILDUP IN FLUIDS IN HIGH VOLTAGE SYSTEMS

BACKGROUND OF THE INVENTION

This application is a continuation-in-part of application Ser. No. 140,244, filed Apr. 14, 1980, now abandoned.

The instant invention relates to ionic additives for insulating fluids, and, more particularly, to such additives for insulating fluids flowing in insulating conduits in high voltage systems.

Flowing insulating coolant fluids experience electrostatic charging by a mechanism which involves selective adsorption on the conduit walls of a particular ion present in the fluid. In a system in which the cooling fluid is flowing, the counter ion is carried upstream, resulting in charge separation and thus the production of an electric field. If the wall of the conduit is a grounded conductor, a current, termed the streaming current, will flow to ground. If the wall of the conductor is ungrounded or is an insulating material, an electrical potential, which may become very large, can build up. The magnitude of the electrical potential will be determined by the balance between the rate of charging and the rate of charge leakage. An increase in ion concentration will produce an increase in the rate of charging as well as an increase in the charge leakage rate through the liquid. As a result of these opposing effects, the streaming current goes through a maximum value with increasing ion concentration.

This electrostatic charging problem has previously arisen in several nonelectrical systems, e.g., in pumping petroleum products and in the fuel systems of jet aircraft, where explosion hazards can result. Solutions to these problems have involved the introduction of conducting paths to prevent charge buildup, as for example by introducing ionic additives to flammable petroleum liquids or by introducing conducting or other filters in insulating tubing carrying the flowing liquid. See U.S. Pat. No. 3,619,718, issued to Joseph T. Leonard. With respect to the petroleum industry problems, it is specifically noted that, although the electrification mechanisms appear to be similar there are significantly different problems which occur in high voltage cooling systems for which petroleum industry solutions would be inadequate. In particular, it has been found by the inventors herein that additive concentration and type are very important. For example, in high voltage electrical systems, insulating rather than conductive piping is used. This severely worsens the charge buildup problem. Furthermore, in electrical systems, one must often be concerned with electrophoretic effects which can operate to degrade certain additives. Thus, for high voltage electrical systems, in which the flowing fluid must withstand the system voltage without breakdown, introducing a conductive path through the coolant fluid has been avoided by others, since the insulating characteristics of the coolant have been regarded by them as being essential to the system performance. For example, in "Charging Tendency Measurement of Transformer Oil" by Okubo et al., IEEE Power Engineering Society, February 1979, it has been stated that, "The streaming electrification in a transformer is substantially different in nature from phenomena in other fields, such as, oil transportation through pipes in petroleum industries. One of the main purposes of transformer oil is to provide insulation. For this reason, it must be avoided to use additives that may accelerate charge leakage in insulating oil, and charge generation should be suppressed."

As a further example of prior art in this area, the teachings found in U.S. Pat. No. 3,383,560, issued to Irwin Ginsburgh, should be considered. This patent considers the problem of charge buildup reduction in flammable liquids such as those found in the petroleum industries and, more particularly, in such liquids flowing through nonconductive conduits. However, the solution posed appears to be based upon charge injection from a charge source connected to a series of pointed electrodes disposed through a capacitor-like conduit sectio through which the flammable liquid flows. Ginsburgh specifcally dismisses the use of additives, even for the petroleum industry, as providing unsatisfactory results. With respect to additives for coolant fluids for high voltage equipment cooling systems, the instant inventors have found the opposite to be true. It should also be noted that the systems contemplated in Ginsburgh are not energized by external high voltage sources as are the cooling systems contemplated herein. Accor ingly, electrolytic and/or electrophoretic reactions involving additives are of concern.

In a similar fashion, Leonard in U.S. Pat. No. 3,619,718 considers and dismisses the use of additives, even for petroleum industry problems involving flammable liquids. Leonard, in fact, states that the additive, Shell ASA-3, was not even necessary for his purposes.

SUMMARY OF THE INVENTION

In accordance with a preferred embodiment of the present invention, a fluid mixture for use in coolant flow conduits of high voltage electrical cooling systems comprises a soluble ionic additive in combination with a nonflammable halocarbon insulating liquid coolant. The instant invention further provides a method for controlling static charge in an insulating liquid halocarbon coolant flowing in a high voltage electrical cooling system by passing the coolant through an insulating conduit and adding a soluble ionic additive to the coolant.

Accordingly, an object of the instant invention is to provide an ionic additive for a cooling fluid for electrical systems which provides continuous leakage of the electrostatic charge from the insulating conduit to ground, while at the same time maintaining the high voltage insulating property of the coolant fluid.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DESCRIPTION OF THE PREFERRED EMBODIMENTS

Figure 1:
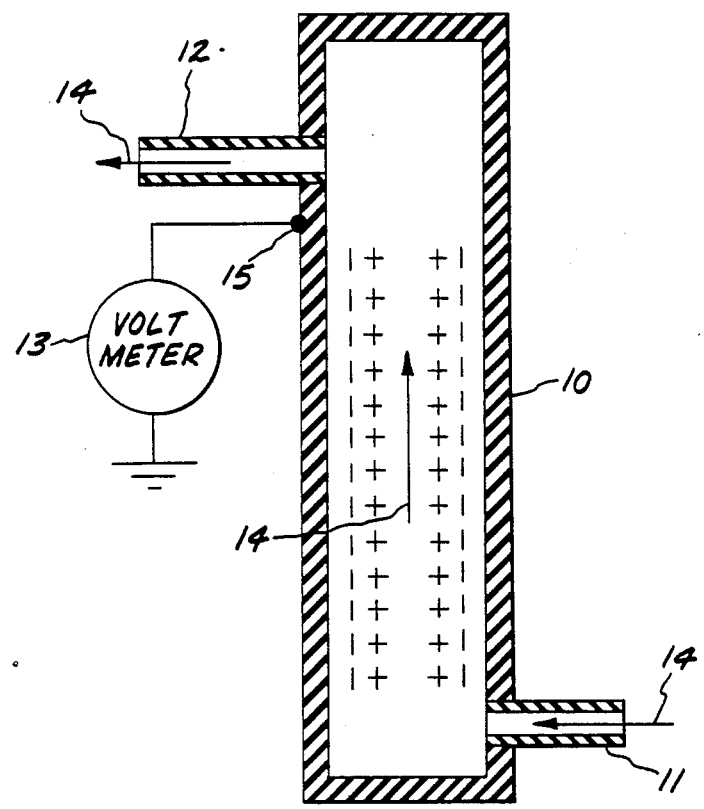
FIG. 1 is a schematic view showing a conduit through which coolant flows.
Figure 2:
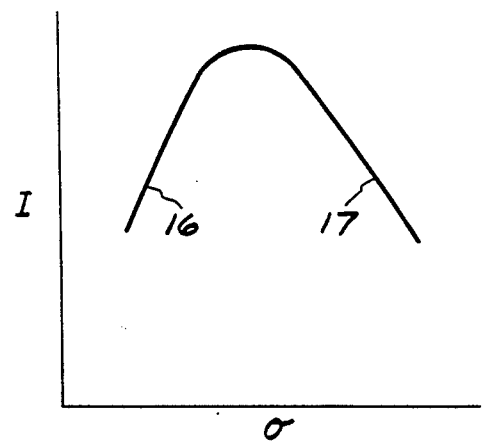
FIG. 2 is a graphical representation of streaming current versus electrical conductivity of the coolant fluid.

The specific features of the instant invention described herein and shown in FIGS. 1 and 2 are merely exemplary, and the scope of the invention is defined in the appended claims.

It had been reported to the instant inventors that electrical tracking and puncture in glass-epoxy pipes carrying Freon 113 was occurring in at least one power station and involved the cooling of thyristors used in high voltage direct current systems. Subsequent experiments determined that high electrical fields were being generated triboelectrically by the motion of Freon in the insulating pipes. (Freon is a registered trademark of E. I. duPont de Nemours & Co., Inc. for the refrigerant trichlorotrifluoroethane.) Subsequent measurement of the conductivity of twelve samples of the fluid revealed no conductivity higher than $6.89 \times 10^{-13}$ mho/cm. Thus, increase in the cooling fluid conductivity over a period of time was dismissed as a cause of electrical breakdown. However, it is now appreciated that a certain increase in conductivity is necessary in the present invention. Additionally, the fluid was investigated for the presence of contaminants which could adversely affect the electrical breakdown characteristics. However, no correlation was found between the particle size of contaminants and breakdown. Subsequent to this the use of additives was considered and extensive experimentation begun to determine the workability of additives for such systems.

In FIG. 1 a coolant conduit 10 is shown having inlet 11 and outlet 12 for flow of coolant fluid therethrough. The mechanism by which the charging occurs involves selective adsorption on the walls of conduit 10 of a particular ion, shown by the minus sign (−) in FIG. 1, present in the coolant liquid. If the liquid is flowing in the direction as shown by arrows 14 the counterions, shown by the plus signs (+) in FIG. 1, are carried upstream resulting in charge separation and thus the production of an electric field. If the wall of conduit 10 is a grounded conductor, a current, I, termed the streaming current, will flow to ground, and can be measured by, for example, the meter 13. If the wall is ungrounded or is an insulator, which is necessary in high voltage equipment, a potential, which may be very large, can build up. This potential will be determined by a balance between the rate of charging and the rate of charge leakage, i.e., charge relaxation.

An increase in ion concentration will produce an increase in the rate of charging as well as increased charge leakage through the liquid. As a result of these opposing effects, the streaming current goes through a maximum with increasing ion concentration as shown in FIG. 2. Therefore, one way to reduce the streaming current, and thus reduce the tendency to build up charges on the walls of insulating conduit 10, is to reduce the electrical conductivity of the coolant liquid by removing impurity ions from the liquid; (i.e., proceed toward the low conductivity end 16 of the relationship shown in FIG. 2). This approach has been suggested, although it is difficult to maintain such high purities in large electrical systems.

In the instant invention we employ coolant conduits of insulating material, such as glass-epoxy compositions, in high voltage electrical equipment and the technique of increasing the conductivity of the coolant fluid by the addition of an ionic additive to reduce the streaming current and charging tendency; (i.e., proceeding toward increasing conductivity end 17 of the relationship shown in FIG. 2). Increasing the conductivity of the coolant fluid in an electrical system operating at high voltage has not previously been considered feasible, since it was believed that such an approach would result in a deterioration of the electrical performance of the coolant. We have found that by employing an appropriate ionic additive, a suitably high conductivity to prevent dangerously high charge buildup can be obtained without seriously reducing the dielectric strength of the coolant liquid. In the present invention, the breakdown voltage of the coolant is reduced by no more than 50% of its initial value. However, the ability of the additive to reduce potential buildup is significantly increased. Additionally, the phenomenon of field grading reduces the field at any given point in the fluid stream by producing a higher conductivity in the high field region and therefore produces an increase in dielectric strength of the fluid.

The preferred requirements for a fluid coolant for an electrical device in a high voltage system are that the fluid should be capable of withstanding a high voltage (e.g., 400 KV over a 36 inch gap) and that the coolant should be chemically stable with the application of voltage to the expected limit of the apparatus range. Therefore, the ionic additive selected for a particular insulating coolant fluid should not unduly reduce the electrical strength of the coolant, and should be chemically stable within the coolant fluid not only upon its introduction into the fluid but also during application of high voltage fields within the fluid.

Commonly-used coolants for electrical apparatus include halocarbons such as Freon 113 and Freon TF. Freon TF is a preferred coolant for high voltage systems. We have found that by adding an ionic additive, such as the petroleum additive sold by Ethyl Corporation under the trademark DCA-48, or that sold by Tretolite Division of Petrolite Corporation under the trademark Tolad T-311, or that sold by Shell Chemical Company under the trademark ASA-3, or that sold by E. I. duPont deNemours and Co., Inc. under the trademark STADIS-450, the desired charge leakage is achieved. The specific combination of coolant and additive would be selected to be effective and compatible with a particular flowing coolant environment. For Freon coolant liquids DCA-48 is the preferred additive.

DCA-48 is the preferred additive for use in the present invention. It is made by the chemical specialties and catalysts division of Mobil Chemical Co., P.O. Box 250, Edison, N.J. DCA-48 is a polymeric amine salt having a molecular weight of about 6,000 and containing between 24 and 28 amine-carboxylic acid functional groups. This salt is supplied in a xylene solvent and, accordingly, some of this solution medium is also present in the mixture employing this particular additive. For DCA-48 it is preferable to employ between about 25 and about 100 ppm of additive to insulating coolant fluid. DCA-48 and Tolad T-311, as described above, are all polymeric amine salts and may be employed to increase the conductivity of insulating liquids such as Freon. ASA-3 is a mixture in xylene of equal parts of chromium alkylsalicylate, calcium didecyl sulfosuccinate and a copolymer of two methacrylates and methyl vinyl pyridine. ASA-3 and STADIS-450 are also employable as additives. However, life tests under high voltage conditions favor the use of DCA-48. (STADIS is a registered trademark of the E. I. duPont DeNemours and Co., Inc.)

While it is possible to specify additive content in terms of parts per million, it is preferable to do so in terms of conductivity of the resultant mixture. In general, it is desirable to increase the conductivity up to a value of about $10^{-10}$ mho/cm. However, depending on voltage ratings of the cooling system in which the mixture is employed, conductivities of $10^{-9}$ mho/cm may also be employed.

A combination of Freon TF and DCA-48 in which the concentration of DCA-48 is about 2 parts per million by weight has been tested, and it was found that this combination produces a conductivity in Freon TF of $3 \times 10^{-12}$ mho/cm and reduced the dielectric strength of the Freon TF by a maximum of 25%. This combination of additive and coolant provided a reduction in electrostatic voltage buildup at an electrode placed at point 14 (FIG. 1), when ungrounded, from 100 KV for Freon TF without the additive to less than 10 KV for the mixture of Freon TF with DCA-48. Further tests have shown that concentration up to 2000 parts per million by weight of ionic additive in coolant liquid are effective, and that a range of ionic additive concentration of 2–100 parts per million by weight is preferred, especially for DCA-48. This shows clearly that the instant method of controlling static charging in a coolant fluid is effective as well as readily adaptable to any system for example, high voltage transmission systems, typically AC systems operating at 138–1300 KV, or DC systems operating at 100–1200 KV DC.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A fluid mixture for use in coolant flow conduits of high voltage electrical equipment coolant systems, said mixture comprising a nonflammable insulating halocarbon liquid coolant in combination with at least one ionic additive in an amount effective to increase the electrical conductivity of said mixture, but insufficient to impair its electrical insulating function, said additive being soluble in said coolant.

2. The mixture of claim 1 wherein said ionic additive comprises a polymeric amine salt.

3. The mixture of claim 2 wherein said mixture comprises an ionic additive in a concentration by weight of up to 2,000 parts per million of said coolant.

4. The mixture of claim 2 wherein said polymeric amine salt has a molecular weight of about 6,000 and possesses between 24 and 28 amine-carboxylic acid functional groups.

5. The mixture of claim 1 further including solvent media, such as xylene, for said ionic additive.

6. The mixture of claim 2 wherein said polymeric amine salt is present in a concentration by weight of between about 2 and about 100 parts per million of coolant.

7. The mixture of claim 1 wherein said ionic additive is present in said mixture in an amount effective to increase the electrical conductivity of said mixture up to about $10^{-9}$ mho/cm.

8. The mixture of claim 1 in which said halocarbon comprises Freon 113.

9. A method for controlling static charge in a liquid halocarbon coolant flowing in a conduit disposed in a high voltage electrical systems, comprising:
passing said coolant through an insulating conduit disposed on said high voltage electrical system; and
adding at least one soluble ionic additive to said liquid coolant to form a mixture of same and to prevent high electrostatic charge buildup in said coolant liquid or on the walls of said insulating conduit by providing an efficient charge relaxation mechanism in said liquid coolant, said coolant being added in an amount effective to increase the electrical conductivity of said mixture but insufficient to impair its electrical insulating function.

10. The method of claim 9 wherein said step of adding an ionic additive comprises adding a polymeric amine salt., 11. The method of claim 10 wherein said step of adding an ionic additive comprises adding said additive to a volume of liquid halocarbon to produce a concentration by weight of up to 2,000 parts per million of said additive.

12. The method of claim 10 wherein said polymeric amine salt has a molecular weight of about 6,000 and possesses between 24 and 28 amine-carboxylic acid functional groups.

13. The method of claim 9 in which said mixture further includes solvent media, such as xylene, for said ionic additive.

14. The method of claim 10 wherein said polymeric amine salt is present in a concentration by weight of between about 2 and about 100 parts per million.

15. The method of claim 9 in which said ionic additive is present in an amount effective to increase the electrical conductivity of said mixture up to about $10^{-9}$ mho/cm.

16. The method of claim 9 in which said halocarbon liquid comprises Freon 113.

* * * * *